(12) United States Patent
Cheng et al.

(10) Patent No.: US 10,840,114 B1
(45) Date of Patent: Nov. 17, 2020

(54) RAPID THERMAL ANNEAL APPARATUS AND METHOD

(71) Applicant: Raytheon Company, Waltham, MA (US)

(72) Inventors: Kezia Cheng, Lowell, MA (US); Christopher J. MacDonald, Medford, MA (US); Kamal Tabatabaie Alavi, Sharon, MA (US); Adrian D. Williams, Methuen, MA (US)

(73) Assignee: Raytheon Company, Waltham, MA (US)

( * ) Notice: Subject to any disclaimer, the term of this patent is extended or adjusted under 35 U.S.C. 154(b) by 52 days.

(21) Appl. No.: 15/495,190

(22) Filed: Apr. 24, 2017

Related U.S. Application Data

(63) Continuation of application No. 15/219,859, filed on Jul. 26, 2016, now abandoned.

(51) Int. Cl.
| | | |
|---|---|---|
| *H01L 21/67* | (2006.01) | |
| *H01L 21/32* | (2006.01) | |
| *H01L 21/68* | (2006.01) | |
| *H01L 21/687* | (2006.01) | |
| *H01L 21/324* | (2006.01) | |

(52) U.S. Cl.
CPC ...... *H01L 21/67115* (2013.01); *H01L 21/324* (2013.01); *H01L 21/68735* (2013.01); *H01L 21/68785* (2013.01)

(58) Field of Classification Search
CPC .......... H01L 21/67115; H01L 21/324; H01L 21/68735; H01L 21/68785

USPC .............. 257/E21.16, E21.333; 438/795
See application file for complete search history.

(56) References Cited

U.S. PATENT DOCUMENTS

| | | | |
|---|---|---|---|
| 4,927,991 A | 5/1990 | Wendt et al. | |
| 5,585,027 A | 12/1996 | Young | |
| 6,035,100 A * | 3/2000 | Bierman | H01L 21/67017 118/50.1 |
| 6,093,252 A * | 7/2000 | Wengert | H01L 21/68785 118/719 |
| 6,342,691 B1 | 1/2002 | Johnsgard et al. | |
| 6,339,510 B1 | 6/2002 | Riley et al. | |
| 6,476,368 B2 | 11/2002 | Aronsson et al. | |
| 6,861,321 B2 * | 3/2005 | Keeton | H01L 21/67109 118/724 |
| 6,905,983 B2 | 6/2005 | Itani | |
| 7,525,075 B1 | 4/2009 | Watkins et al. | |
| 9,066,375 B2 | 6/2015 | Lafferty | |
| 2002/0083899 A1 * | 7/2002 | Komeno | H01L 21/68764 118/730 |

(Continued)

OTHER PUBLICATIONS

U.S. Patent Application of Kezia Cheng, et al., U.S. Appl. No. 15/219,859, filed Jul. 26, 2016, 19 pages.

*Primary Examiner* — Sheikh Maruf
(74) *Attorney, Agent, or Firm* — Daly, Crowley, Mofford & Durkee, LLP

(57) ABSTRACT

Apparatus and method for heating a wafer having semiconductor material. The apparatus includes: a chamber, a source of radiant heat; a source of gas; and a susceptor disposed in the chamber to receive and absorb heat radiated by the source of radiant heat; the susceptor having an opening therein to allow a flow of gas to pass from the source of gas to pass through an interior region of the susceptor and over the wafer.

17 Claims, 16 Drawing Sheets

(56) References Cited

U.S. PATENT DOCUMENTS

| | | | |
|---|---|---|---|
| 2002/0195437 A1* | 12/2002 | Kusuda | C30B 31/12 219/390 |
| 2003/0107865 A1 | 6/2003 | Masuda et al. | |
| 2004/0108519 A1* | 6/2004 | Itani | H01L 21/324 257/200 |
| 2004/0149715 A1* | 8/2004 | Timans | C30B 31/12 219/390 |
| 2005/0258162 A1* | 11/2005 | Kusuda | F27B 17/0025 219/411 |
| 2006/0102081 A1 | 5/2006 | Ueno et al. | |
| 2006/0225657 A1* | 10/2006 | Mizushima | C23C 16/345 118/724 |
| 2006/0249078 A1* | 11/2006 | Nowak | B05D 3/0209 118/724 |
| 2007/0291818 A1* | 12/2007 | Yasuda | H01L 21/67115 374/43 |
| 2008/0190909 A1* | 8/2008 | Yokouchi | H01L 21/68792 219/385 |
| 2008/0219824 A1* | 9/2008 | Newman | H01L 21/67115 414/744.5 |
| 2008/0273867 A1* | 11/2008 | Camm | H01L 21/67115 392/416 |
| 2009/0184109 A1* | 7/2009 | Sawada | H01L 21/67109 219/643 |
| 2009/0274454 A1* | 11/2009 | Aderhold | H01L 22/26 392/416 |
| 2009/0323756 A1* | 12/2009 | Tenzek | H05B 6/24 373/138 |
| 2010/0092697 A1* | 4/2010 | Poppe | C30B 25/105 427/585 |
| 2010/0092698 A1* | 4/2010 | Poppe | C30B 25/165 427/585 |
| 2010/0107974 A1* | 5/2010 | Givens | H01L 21/67103 118/500 |
| 2010/0111513 A1* | 5/2010 | Nishihara | H01L 21/67115 392/418 |
| 2010/0111648 A1* | 5/2010 | Tamura | H01L 21/67248 414/217 |
| 2010/0181024 A1* | 7/2010 | White | C23C 16/45565 156/345.33 |
| 2010/0285629 A1 | 11/2010 | Suzuki | |
| 2010/0307686 A1* | 12/2010 | Iizuka | H01L 21/67103 156/345.34 |
| 2011/0067632 A1* | 3/2011 | Poppe | C23C 16/45521 118/728 |
| 2011/0277688 A1* | 11/2011 | Trujillo | F16F 15/0275 118/715 |
| 2011/0277690 A1* | 11/2011 | Rozenzon | C23C 16/45561 118/723 MW |
| 2012/0085752 A1* | 4/2012 | Rinaldi | H05B 6/129 219/634 |
| 2012/0133089 A1* | 5/2012 | Kobayashi | C21D 1/40 266/155 |
| 2012/0187083 A1* | 7/2012 | Hashizume | B05C 11/00 216/37 |
| 2012/0238110 A1* | 9/2012 | Yokouchi | H01L 21/67748 438/795 |
| 2013/0109192 A1* | 5/2013 | Hawkins | C23C 16/45521 438/758 |
| 2013/0193132 A1* | 8/2013 | Serebryanov | H01L 21/68764 219/385 |
| 2014/0127368 A1 | 5/2014 | Lafferty | |
| 2014/0263268 A1* | 9/2014 | Cong | H05B 1/0227 219/392 |
| 2015/0007774 A1 | 1/2015 | Iwasaki et al. | |
| 2015/0037019 A1* | 2/2015 | Collins | H01L 21/67115 392/418 |
| 2015/0162230 A1* | 6/2015 | Bautista | H01L 21/68 118/725 |
| 2015/0206786 A1* | 7/2015 | Serebryanov | H01L 21/67115 438/795 |
| 2015/0226485 A1 | 8/2015 | Steinlage et al. | |
| 2016/0079085 A1* | 3/2016 | Aoyama | H05B 3/0047 438/530 |
| 2016/0133504 A1* | 5/2016 | Chu | H01L 21/67115 165/146 |
| 2016/0141175 A1* | 5/2016 | Yan | H01L 21/02046 438/509 |
| 2017/0194163 A1* | 7/2017 | Cosceev | H01L 21/68785 |
| 2017/0213759 A1* | 7/2017 | Ma | H01L 21/67115 |
| 2017/0221715 A1* | 8/2017 | Tanimura | H01L 21/02667 |
| 2018/0254224 A1* | 9/2018 | Kitazawa | H01L 21/324 |
| 2019/0157168 A1* | 5/2019 | Kawarazaki | H01L 22/12 |
| 2019/0267250 A1* | 8/2019 | Tanimura | H01L 21/67115 |
| 2020/0243402 A1* | 7/2020 | Kawarazaki | H01L 21/324 |

* cited by examiner

RAPID THERMAL ANNEAL APPARATUS AND METHOD

CROSS REFERENCE TO RELATED APPLICATION

This Application is a continuation of prior application Ser. No. 15/219,859, filed Jul. 26, 2016, which application is hereby incorporated herein by reference in its entirety.

TECHNICAL FIELD

This disclosure relates generally to rapid thermal anneal (RTA) apparatus and more particularly to RTA apparatus adapted for use with susceptors.

BACKGROUND

As is known in the art, rapid thermal anneal (RTA) apparatus has been used in the semiconductor industry for many years. Early, the apparatus was used in processing silicon wafers during an implantation activation phase of the fabrication. One such arrangement is shown in FIGS. 1A and 1B. There, a silicon wafer was positioned between a set of horizontally disposed upper heating lamps and a set of horizontally disposed lower heating lamps. A flow of gas, such as for example nitrogen, $N_2$, was passed over the wafer, as indicated.

In more recent times, RTA apparatus has been used to alloy metals such as when forming ohmic contacts to the active devices, for example, source and drain contacts for Field Effect Transistors (FETs) formed in compound semiconductor material of the wafer, such as GaN or GaAs compound semiconductor material. In some applications, a susceptor, such as a graphite susceptor, which absorbs heat received by radiation from the upper and lower sets of heating lamps, as shown in FIGS. 2A and 2B. The heated susceptor then transfers its heat to the susceptor enclosed wafer to heat the wafer and thereby alloy the metals and produce the ohmic contacts. Here, the gas, for example, nitrogen, is passed over the susceptor as the susceptor with the enclosed wafer is subjected to the heat generated by the upper and lower sets of heating lamps and absorbed by the susceptor, as indicated in FIGS. 2A and 2B. More particularly, the susceptor includes susceptor tray which has a centrally disposed recess therein to provide a susceptor tray wafer support portion, as shown in FIG. 2A. After the wafer is placed in the recessed susceptor tray wafer support portion, a susceptor tray cover is placed on the outer peripheral portions of the susceptor tray. It is noted the tray cover rests on the outer peripheral portions of the tray while the inner portions of the cover are suspended over the recessed wafer. The susceptor, with the now enclosed wafer, is placed in the RTA apparatus, between the upper and lower sets of heating lamps, as shown in FIGS. 2A and 2B. A flow of gas, such as nitrogen, is passed over the susceptor; it being noted that, as described above, the wafer is enclosed within the susceptor as the gas is passed over the susceptor during the heating of the susceptor by the upper and lower sets of lamps and the transfer of such heat to the wafer to produce alloying of metal and semiconductor and thereby produce an ohmic contact with the semiconductor.

SUMMARY

In accordance with the present disclosure, an apparatus is provided for heating a wafer having a semiconductor material. The apparatus includes: a chamber; a source of radiant heat; a source of gas; a susceptor disposed in the chamber to receive and absorb heat radiated by the source of radiant heat; the susceptor having an opening therein to allow a flow of gas to pass from the source of gas through an interior region of the susceptor and over the wafer.

In one embodiment, the susceptor has a susceptor tray, such susceptor tray having a wafer support portion for supporting the wafer; and a susceptor tray cover; and wherein the susceptor tray cover is disposed over the wafer; and wherein the interior region is between the susceptor tray and the susceptor tray cover.

In one embodiment, the susceptor tray cover is disposed on the susceptor tray.

In one embodiment, the susceptor includes: a standoff for supporting the susceptor tray cover over the susceptor tray to provide the interior region between the susceptor tray cover and the susceptor tray.

In one embodiment, the susceptor tray cover has an inlet and an outlet and wherein the inlet and outlet provide the opening therein to allow the flow of gas to pass from the source of gas into interior region of the susceptor and then through the interior region and then out of the interior region through the outlet.

In one embodiment, an apparatus is provided for heating a wafer having a semiconductor material is provided comprising: a chamber; a source of radiant heat; a source of gas; and a susceptor disposed in the chamber susceptor and disposed to receive and absorb heat radiated by the source of radiant heat. The susceptor includes: a susceptor tray, such susceptor tray having a wafer support portion for supporting the wafer; and a susceptor tray cover. The susceptor tray cover is disposed over the wafer support portion. The susceptor tray cover has an inlet and an outlet and wherein the inlet receives a flow of gas from the source of gas, wherein the flow of gas received by the inlet passes between the susceptor tray and the susceptor tray cover through an interior region the susceptor and then exits the interior region.

In one embodiment, an apparatus is provided for heating a wafer having a semiconductor material. The apparatus includes: a chamber; a source of radiant heat; a source of gas; a susceptor disposed in the chamber to receive and absorb heat radiated by the source of radiant heat with the wafer disposed within the susceptor; the susceptor having an opening therein to allow a flow of gas to pass from the source of gas into the susceptor and then over the wafer while heat absorbed by the susceptor is transferred to the wafer.

In one embodiment, the susceptor has a susceptor tray, such susceptor tray having a wafer support portion for supporting the wafer; and a susceptor tray cover; and wherein the wafer is disposed on the wafer support portion and the susceptor tray cover is disposed over the wafer.

In one embodiment, the susceptor tray cover is disposed on the susceptor tray.

In one embodiment, the susceptor includes: a standoff for supporting the susceptor tray cover over the susceptor tray providing a space between the susceptor tray cover and the susceptor tray; and wherein the space provides the opening to allow the flow of gas to pass from the source of gas into the susceptor and then over the wafer while heat absorbed by the susceptor is transferred to the wafer.

In one embodiment, the susceptor tray cover has an inlet and an outlet and wherein the inlet and outlet provide the opening therein to allow the flow of gas to pass from the source of gas into the susceptor and then over the wafer while heat absorbed by the susceptor is transferred to the wafer.

In one embodiment, an apparatus is provided for heating a wafer having a semiconductor material. The apparatus includes: a chamber, a source of radiant heat; a source of gas; and a susceptor disposed in the chamber susceptor. The susceptor includes: a susceptor tray, such susceptor tray having a wafer support portion for supporting the wafer; and a susceptor tray cover. The susceptor tray cover is disposed over the wafer support portion to receive and absorb heat radiated by the source of radiant heat. The susceptor tray cover has an inlet and an outlet. The inlet receives a flow of gas from the source of gas and channels the received gas flow of gas between the susceptor tray and the susceptor tray cover through an interior region of the susceptor over the wafer while heat absorbed by the susceptor is transferred to the wafer and then channels the flow of gas, after passing over the wafer, to the outlet.

In one embodiment, a method is provided for heating a wafer having a semiconductor material. The method includes: providing a susceptor having an opening therein to allow a flow of gas to pass through an interior region of the susceptor, placing the wafer in the interior region of the susceptor, and passing a flow of gas through the interior region of the susceptor while the susceptor absorbs heat radiated by the source of radiant heat and while the absorbed heat is transferred to the wafer.

In one embodiment, the susceptor has a susceptor tray, such susceptor tray having a wafer support portion for supporting the wafer; and a susceptor tray cover; and wherein the wafer is disposed on the wafer support portion and the susceptor tray cover is disposed over the wafer, and wherein the interior region is between the susceptor tray and the susceptor tray cover.

In one embodiment, the semiconductor material has a metal on a surface portion of the semiconductor material and wherein the heating of wafer produces an ohmic contact between the metal and the surface portion of the semiconductor material.

In one embodiment, a susceptor is provided having an opening therein to allow a flow of gas to pass into an interior region of the susceptor and then over a wafer having a semiconductor material.

In one embodiment, the susceptor includes: a susceptor tray having a recessed wafer support portion disposed in an inner region of the susceptor tray for supporting the wafer; and a susceptor tray cover disposed on an outer region of the susceptor tray.

In one embodiment, a standoff is provided for supporting the susceptor tray a predetermined, finite distance over the susceptor cover.

In one embodiment the susceptor cover has a gas flow inlet to pass the gas into an interior region of the susceptor and a gas flow outlet laterally displaced from the gas flow inlet for exiting gas from the interior region of the susceptor The inventors have recognized that because the transfer of the wafer to the interior of a closed susceptor takes place outside of the RTA chamber, ambient air can become trapped inside the closed, wafer holding, susceptor and that with present totally enclosed susceptor such as that shown in FIGS. 2A and 2B, a flow of gas over the such totally closed susceptor cannot purge the trapped air in the wafer holding closed susceptor. Thus, the presence of oxygen and other contaminants (such as outgas from susceptor) in the closed susceptor during alloy degrades the quality of an ohmic contact. More particularly, the inventors have recognized that ambient air and moisture oxidizes the aluminum at the edge of the source and drain electrodes of a PET where the ohmic metal is exposed thereby forming the defects in the ohmic contact. The disclosure solves the problem by allowing a flow of gas to purge the trapped air/moisture in the susceptor before and during the alloy process. It ensures the alloy process is done in an inert environment. One embodiment includes ducts, for example NACA ducts in the cover to direct a flow of gas into and out of the susceptor and another embodiment, uses posts as standoffs to elevate the cover and thereby allow a flow of gas over the wafer.

More particularly, the inventors have discovered that, when using a wafer with Gallium Nitride (GaN) semiconductor material and trying to form an ohmic contact with it by alloying a stack of Tantalum (Ta), Aluminum (Al) and Tantalum (Ta) with the semiconductor material in an enclosed susceptor such as shown in FIGS. 2A and 2B, unwanted nodules were formed around the edge of the source and drain electrodes of a Field Effect Transistor (FET). These unwanted nodules may cause leakage or short circuits if they extend into the gate channel of the FET and may have an adverse effect on the performance and long term reliability of the FET. When the alloying was perform in the RTA apparatus without the susceptor cover, the ohmic morphology greatly improved without any nodule. The effect of trapped air in the susceptor has been confirmed multiple times using different analytical techniques. The results are consistent. Although not using the cover is one option to solving this problem, it is not an ideal solution because in the RTA process, heat from the halogen lamps is radiated and absorbed by the graphite susceptor. The susceptor in turn transfers heats to the wafer. Omitting the cover will likely change the thermal dynamics of the alloy process. The inventors' solution is to allow the nitrogen flow in the RTA chamber to purge the trapped air in the susceptor. This can be done in a number of ways: One approach is to incorporate NACA ducts in the susceptor cover to channel Nitrogen ($N_2$) into and out of the susceptor. The NACA ducts are aerodynamically efficient and do not disrupt the nitrogen flow in the RTA chamber. Because the NACA ducts are flush with the cover, there is no change to the overall dimension of the susceptor. Another approach is to use four posts, or standoffs, to elevate the cover so that nitrogen can flow over the wafer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
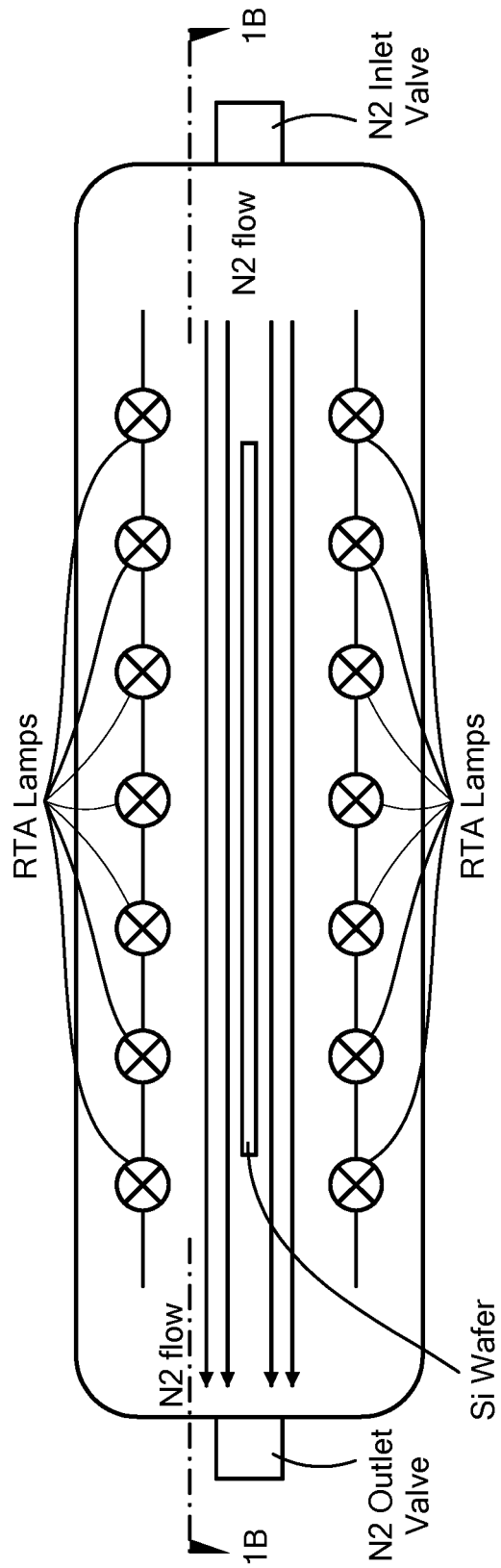
FIGS. 1A and 1B are vertical and plan cross-sectional, diagrammatical sketches, respectively, of RTA apparatus according to the PRIOR ART.
Figure 1B:
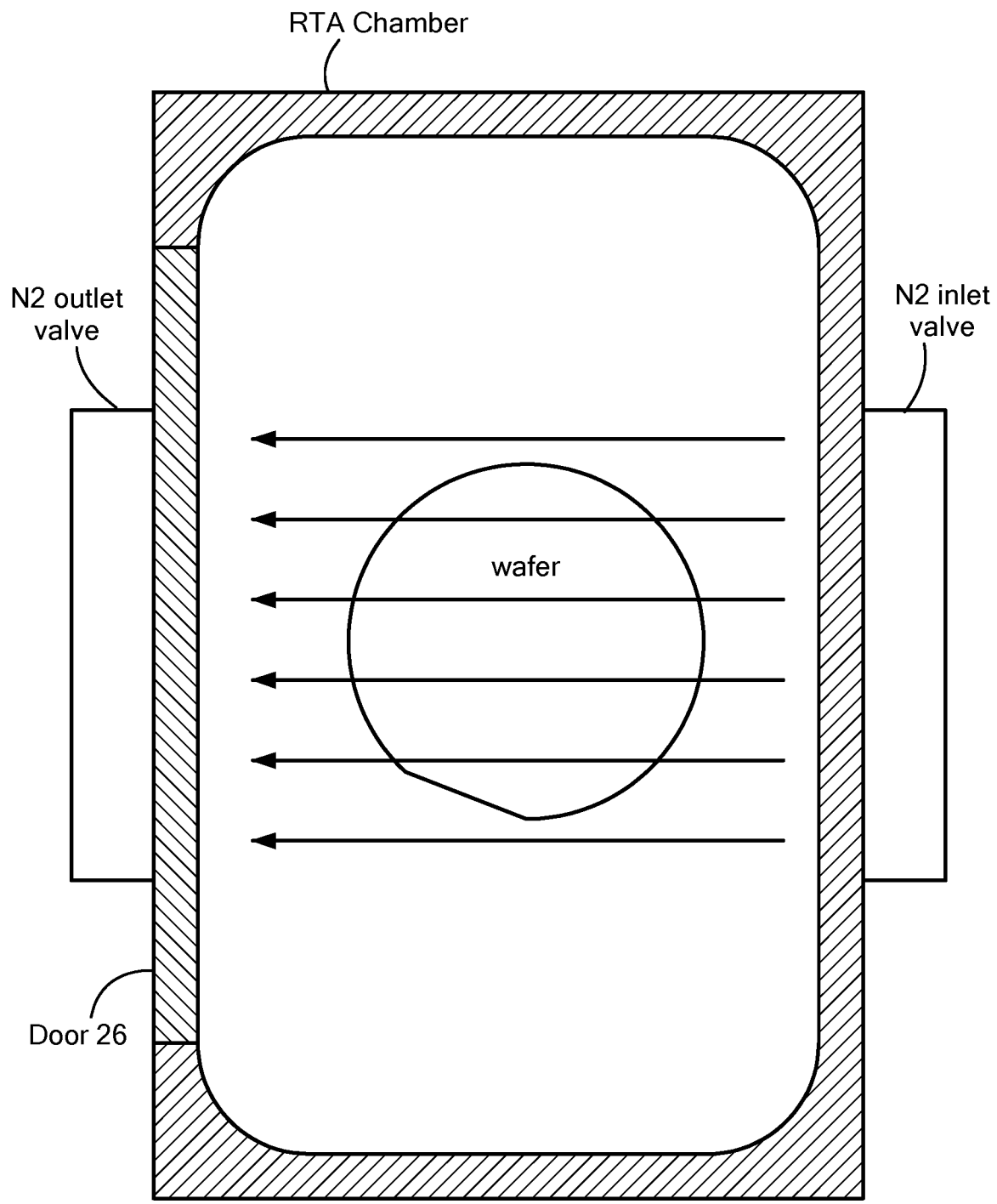
Figure 2A:
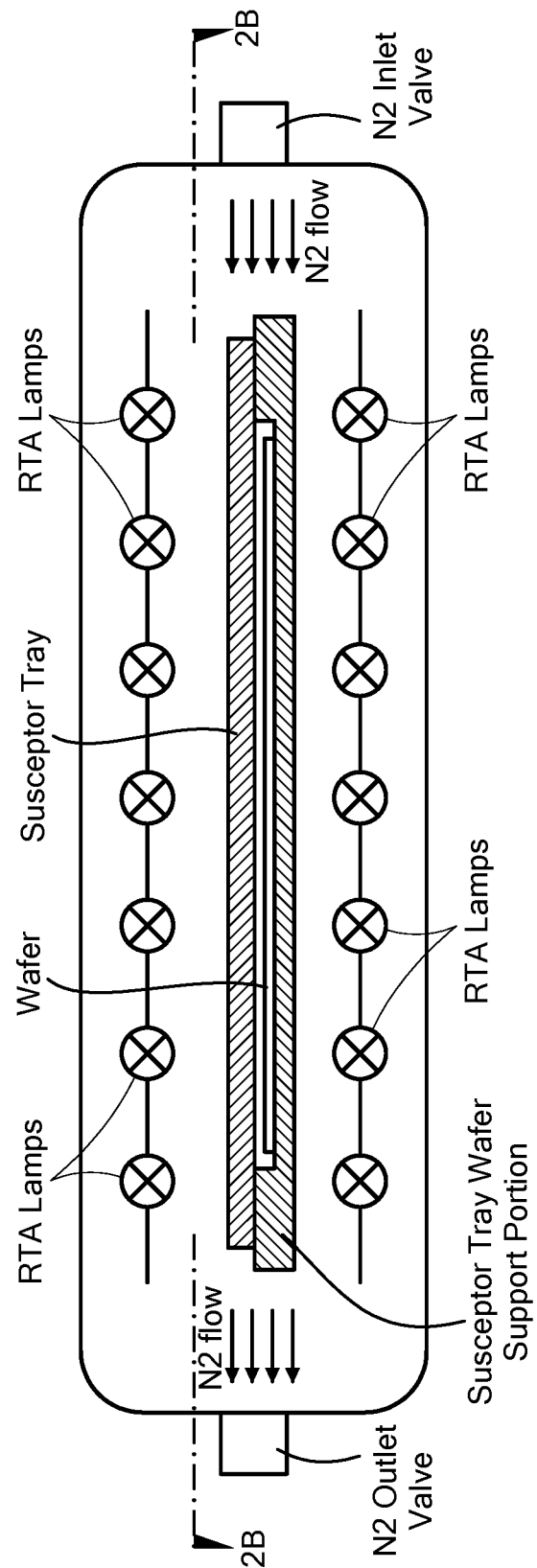
FIGS. 2A and 2B are elevation and plan cross-sectional, diagrammatical sketches, respectively, of RTA apparatus according to the PRIOR ART.
Figure 2B:
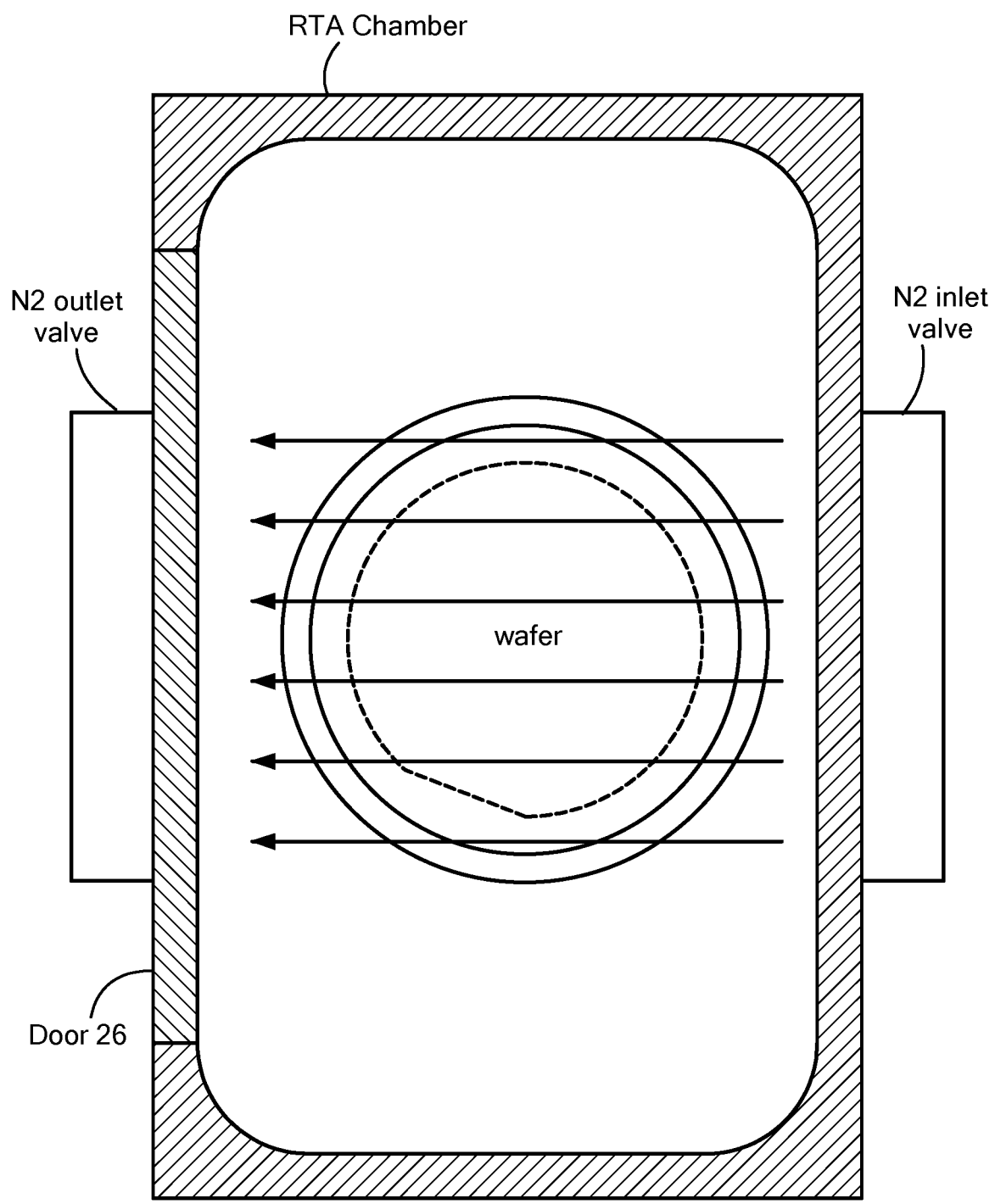
Figure 3:
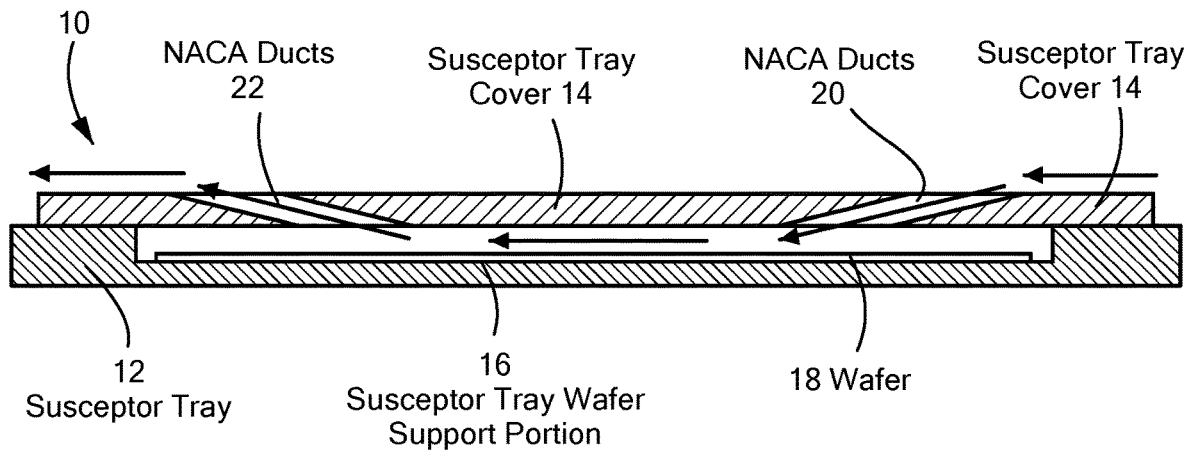
FIG. 3 is an elevation cross-sectional sketch of a susceptor for use in RTA apparatus according to the disclosure.

Referring now to FIG. 3, a susceptor 10 is shown. Here, the susceptor 10 includes a graphite susceptor tray 12, shown in FIGS. 3A and 3B and a graphite susceptor tray cover 14, shown in FIGS. 4A and 4B.

Figure 3A:
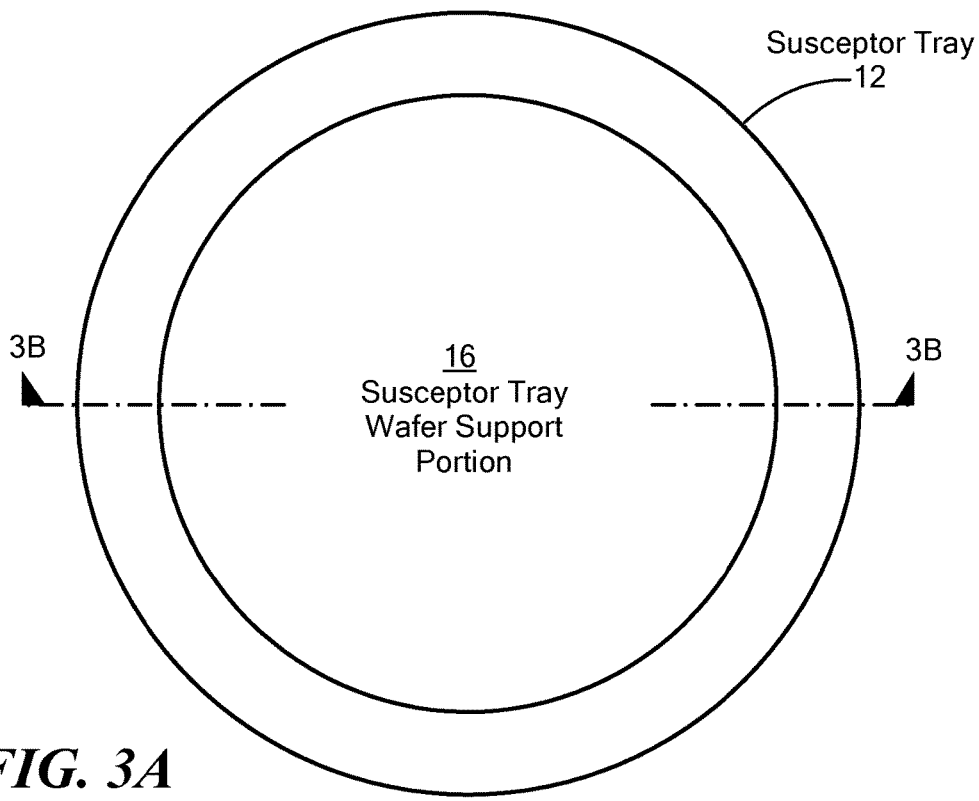
FIG. 3A is a plan view of a susceptor tray portion of the susceptor of FIG. 3 according to the disclosure.
Figure 3B:
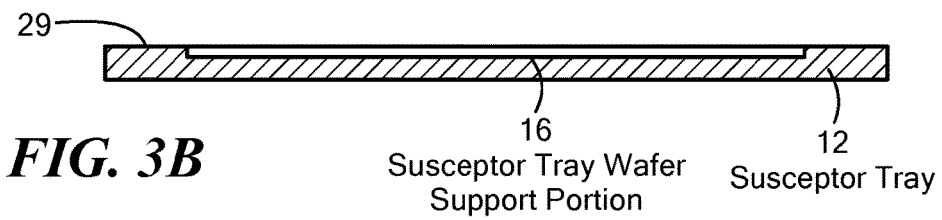
FIG. 3B is a cross sectional view of the susceptor tray portion of FIG. 3A, such cross section being taken along line 3B-3B of FIG. 3A.
Figure 4A:
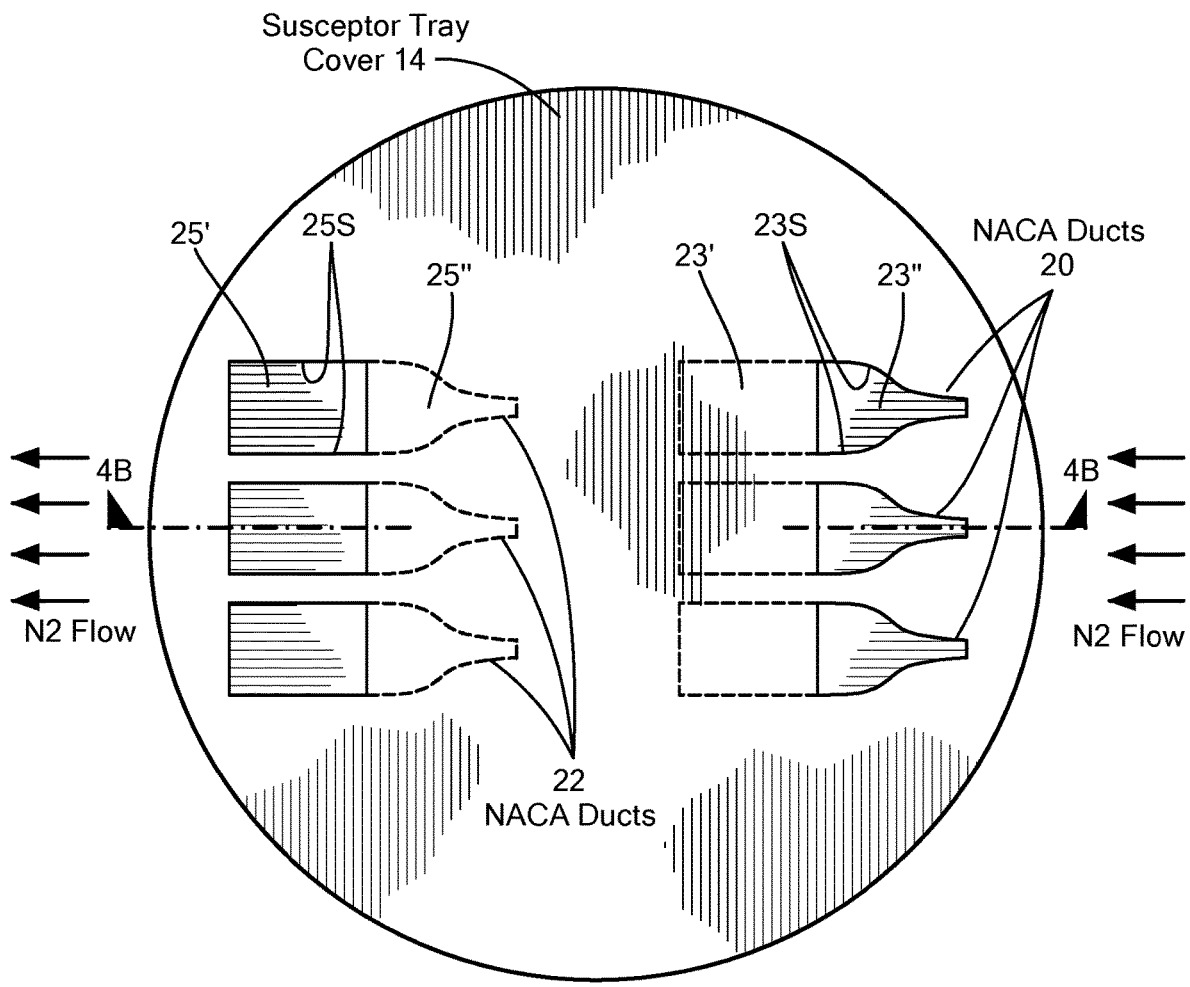
FIG. 4A is a plan view of a susceptor tray cover of the susceptor of FIG. 3 according to the disclosure.
Figure 4B:
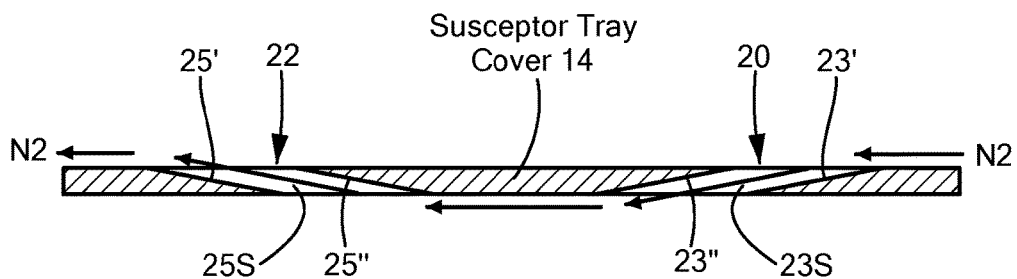
FIG. 4B is a cross sectional view of the susceptor tray cover of FIG. 4A, such cross section being taken along line 4B-4B of FIG. 4A.
Figure 4C:
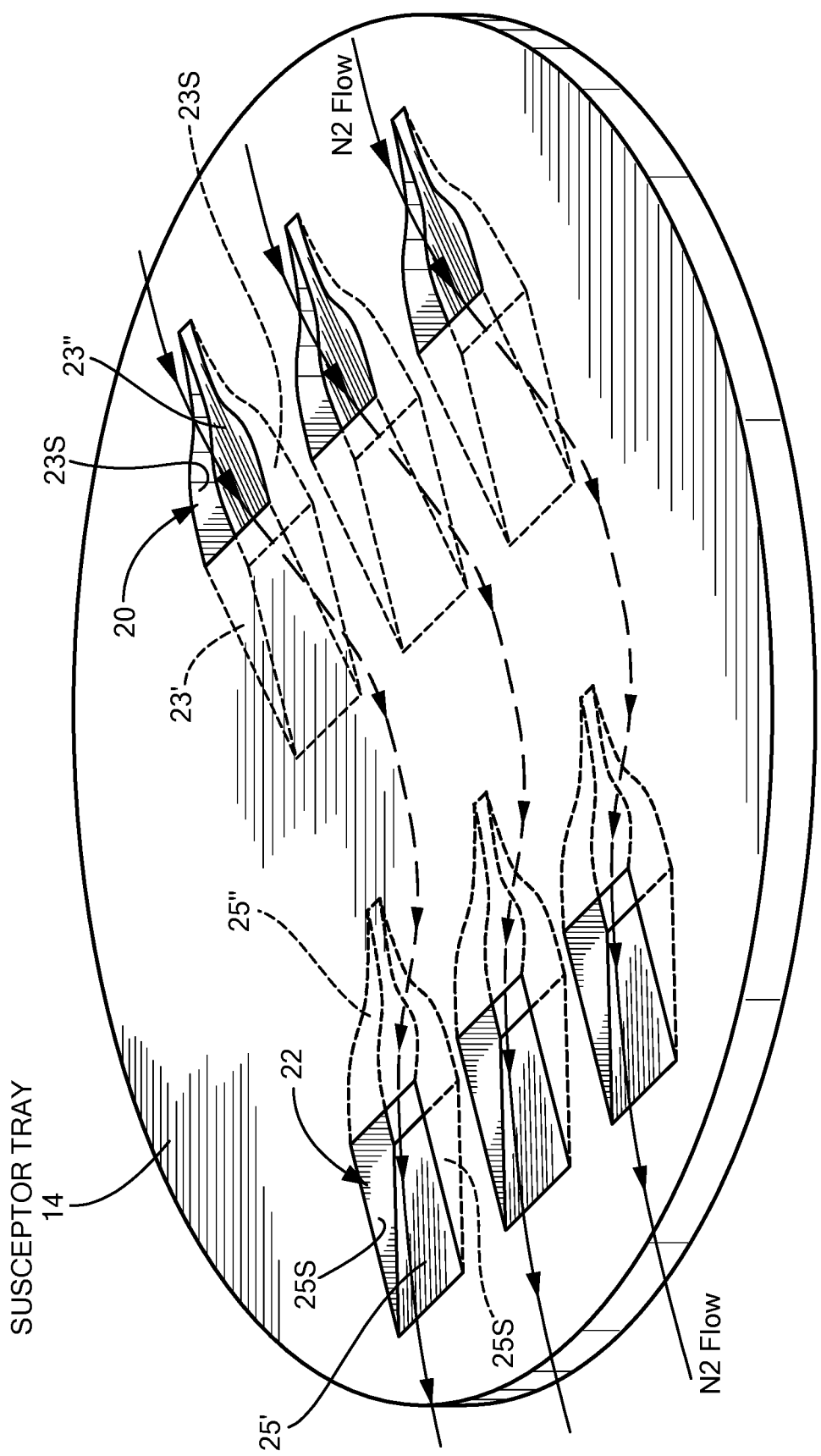
FIG. 4C is a perspective view of the susceptor tray cover of FIGS. 4A and 4B.
Figure 5:
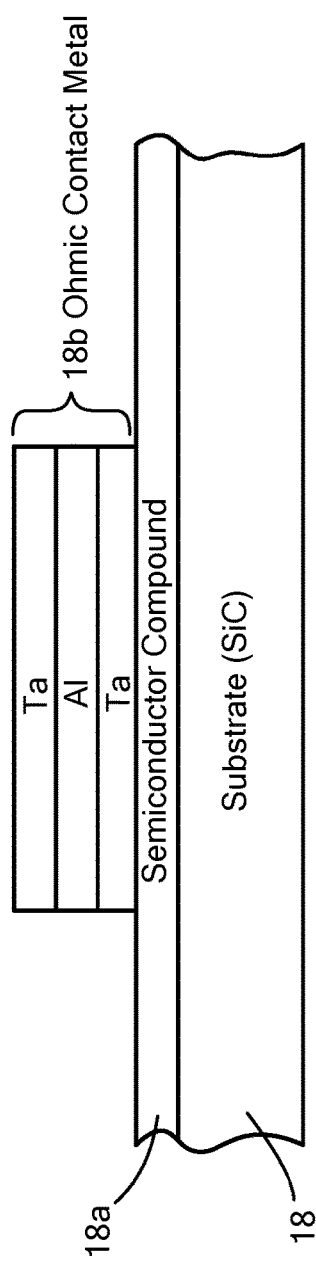
FIG. 5 is a cross sectional sketch of a portion of a wafer for processing in the RTA apparatus of FIG. 3.

Referring first to the graphite susceptor tray 12, shown in FIGS. 3A and 3B, it is noted that the susceptor tray 12 has machined therein a recessed, centrally disposed, susceptor tray wafer support portion 16 for holding a wafer 18, here having a substrate, here for example, silicon carbide, SiC, shown in FIG. 5, having a semiconductor material 18a, such as a compound semiconductor material such as a Group I-V material, here for example GaN or GaAs on a substrate 18, here, and an contact metal, for example a stack of Tantalum (Ta), Aluminum (Al), Tantalum (Ta), for example, as shown in FIG. 5. The graphite susceptor tray cover 14, shown in FIGS. 4A, 4B, and 4C is machined and has a plurality of openings, here for example, inlet ducts 20, here for example, NACA duct inlets and a plurality of openings, for example outlet ducts 22, here for example, NACA duct outlets 22, where NACA ducts were developed by the U.S. National Advisory Committee for Aeronautics (NACA). As shown more clearly in FIG. 4B, the NACA duct inlets 20 pass with a downward sloped wall portions 23', 23", between sidewall portions 23S, of the NACA duct 20 through the cover 14 at an acute angle with respect the upper surface of the cover 14 while the NACA duct outlet 22 pass with an upward sloped wall portion 25", 25', between sidewall portions 25S, through the cover 14 at an acute angle with respect the upper surface of the cover 14. Thus, referring also to FIG. 3, the N₂ passes into NACA duct into the interior of the susceptor 10, down the downward sloped wall portion portions 23", 23', over the wafer 18 then up the upward sloped wall portions 25", 25' out of the susceptor 10.

Referring again to FIG. 3, the wafer 18 is placed on the susceptor tray wafer support portion 16 and then the cover 14 rests on the upper outer peripheral portions of the tray 12 after the wafer 18 is placed onto the susceptor tray wafer support portion 16.

Figure 6A:
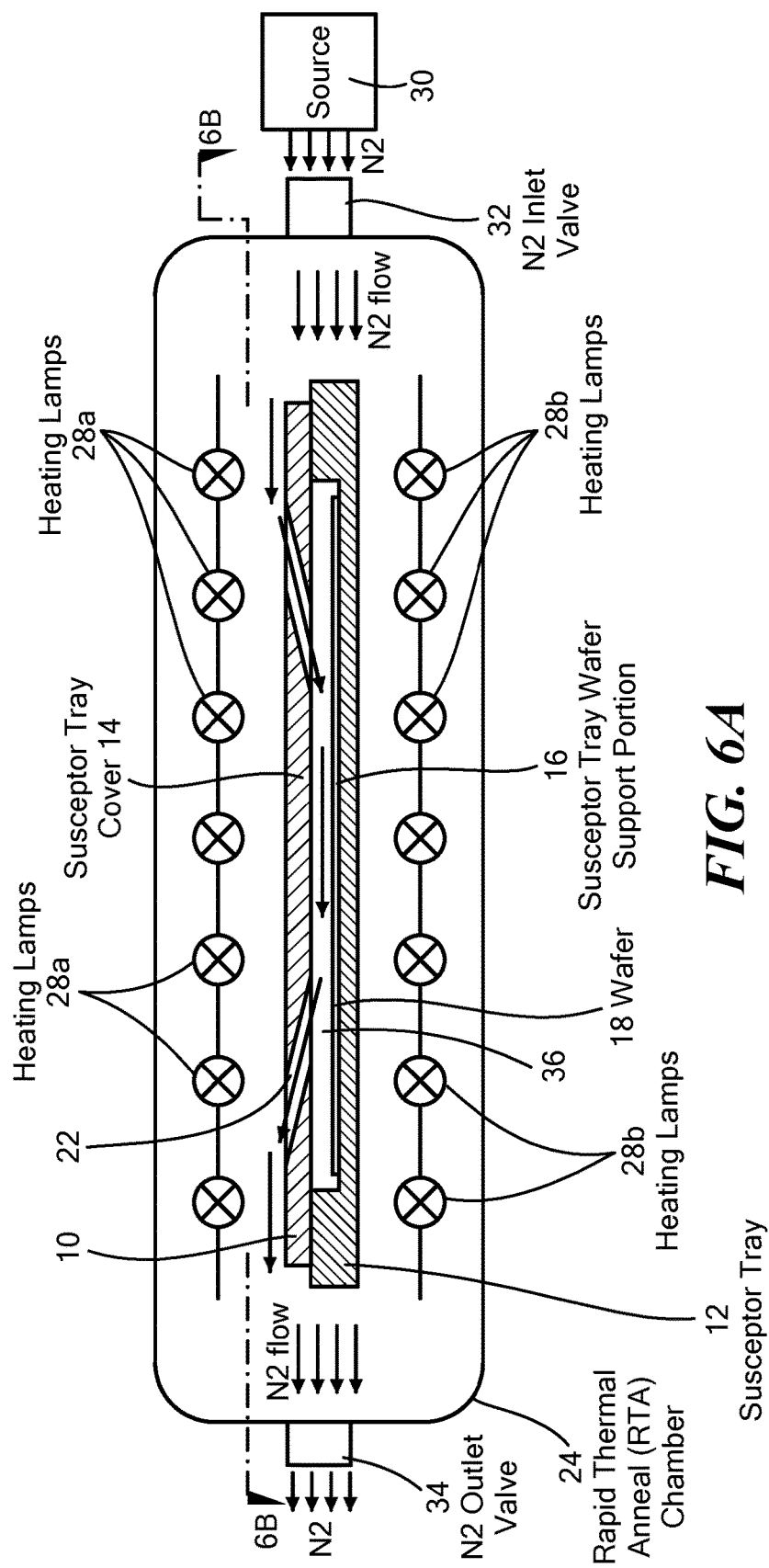
FIGS. 6A and 6B are elevation and plan cross-sectional, diagrammatical sketches, respectively, of RTA apparatus having therein the susceptor of FIG. 3 with the wafer of FIG. 5 according to the disclosure.
Figure 6B:
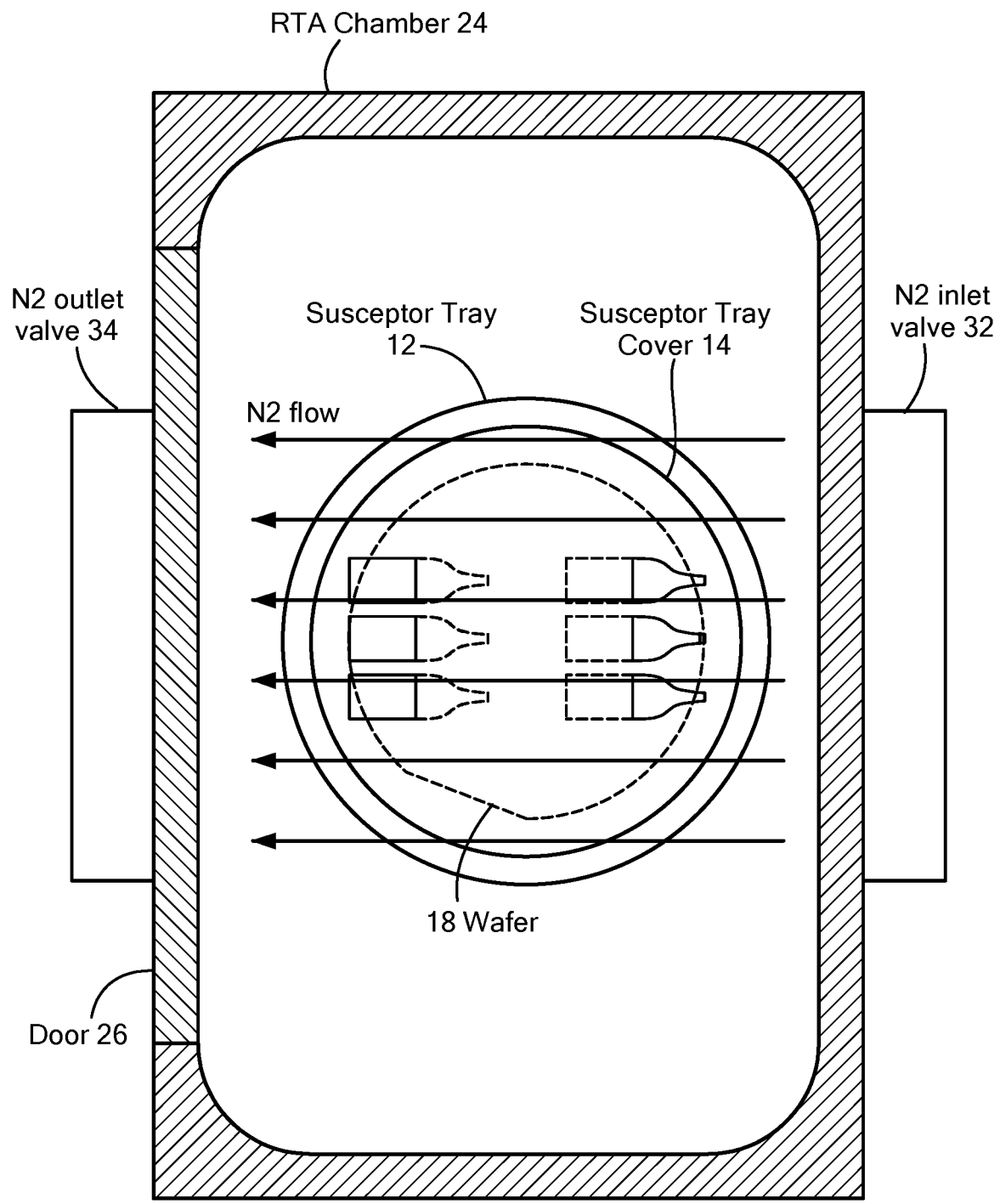
Figure 7A:
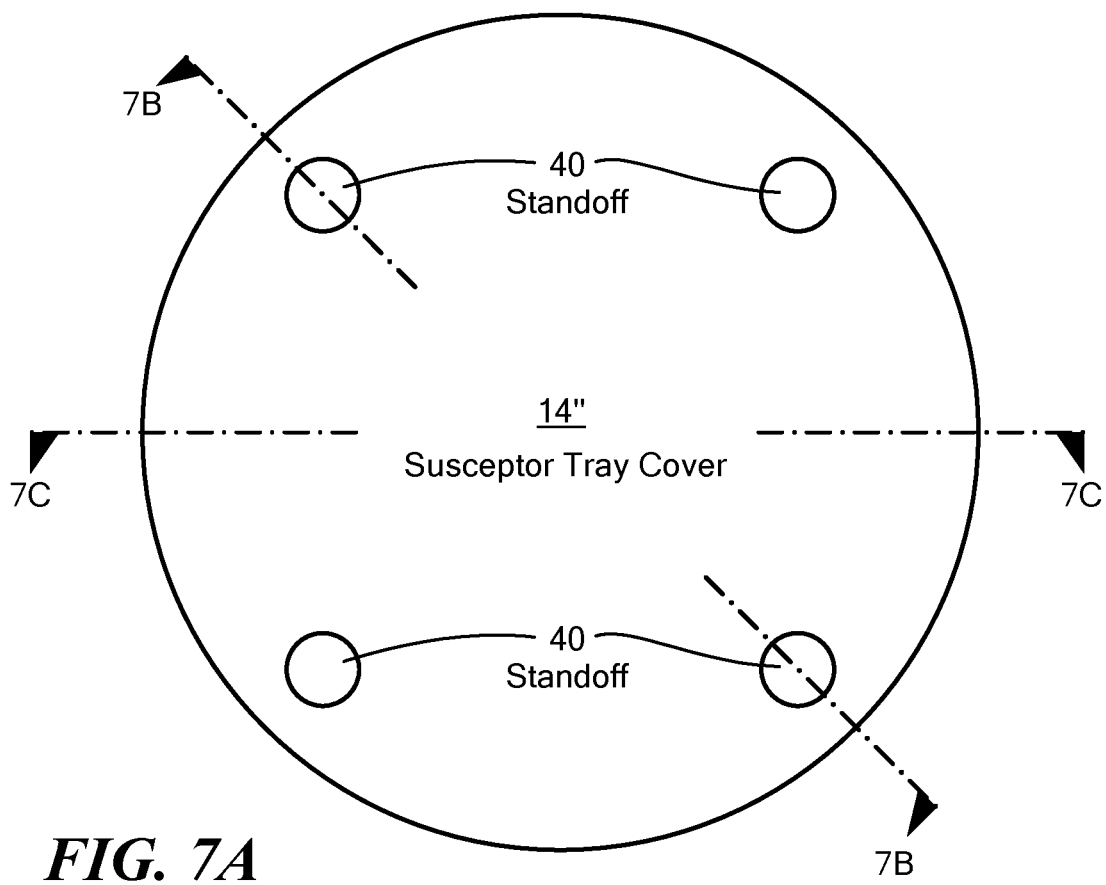
FIG. 7A is a plan view of a susceptor tray cover of a susceptor according to the another embodiment of the disclosure.
Figure 7B:
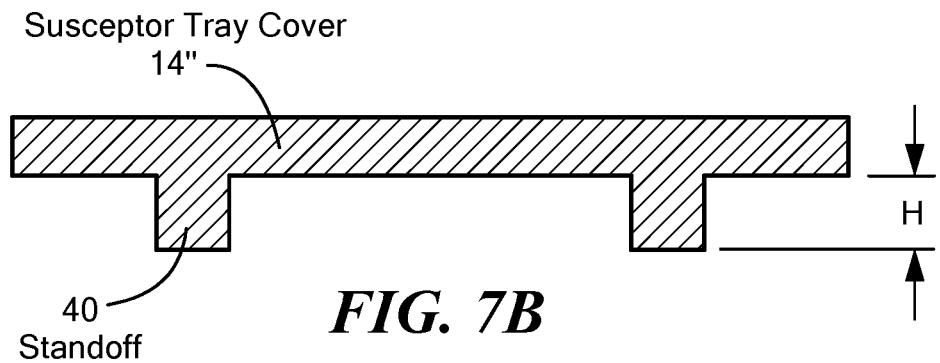
FIG. 7B is a cross sectional view of the susceptor tray cover of FIG. 7A, such cross section being taken along line 7B-7B of FIG. 7A.
Figure 7C:
FIG. 7C is a cross sectional view of the susceptor tray cover of FIG. 7A, such cross section being taken along line 7C-7C of FIG. 7A.

Next, the susceptor 10, with the wafer 18 on the susceptor tray wafer support portion 16 and with the susceptor tray cover 14 on the tray 12, is inserted into an RTA chamber 24, through a door 26 of the RTA chamber 24, as shown in FIGS. 6A and 6B. As shown in FIG. 6A, the RTA chamber has therein a set 28a of horizontally disposed upper radiant heating lamps, here for example, halogen heating lamps radiating energy primarily in the visible radiation band and extending in the Infrared bands and slightly in the ultraviolet bands, and a set 28b of horizontally disposed lower radiant heating lamps, here for example, halogen heating lamps. The susceptor 10 with the wafer 18 therein is positioned between two sets 28a, 28b of heating lamps, as shown in FIG. 6A. A source 30 of nitrogen. N₂, gas is provided as shown in FIG. 6A. The RTA chamber 24 has, at one side thereof, an inlet valve 32 fed by the source 30 of nitrogen gas, and has at the opposite side thereof an outlet valve 34, as in FIGS. 6A and 6B. Thus, during operation of the two sets 28a, 28b of lamps at a relatively low power level, nitrogen gas passes through the inlet valve 32 initially over the tray cover 14 then into the NACA duct inlets 20, into an interior region 36 of the susceptor having the wafer 18, then the gas passes over the wafer 18 then exits the interior region 36 through the NACA duct inlets 20 then passes over the exiting portion of the cover 14 and exits the chamber 24 through the outlet valve 34, as indicated by the arrows in FIGS. 6A and 6B to purge any presence of oxygen and other contaminants from above the wafer 18. The two sets 28a, 28b of lamps are then ramped up to a higher power level with the nitrogen continuing to flow through the susceptor 10 and over the wafer 18. The radiant heat from the two sets of lamps 28a, 28b is absorbed by the susceptor 18 and the heat in the susceptor is transferred to the wafer 18. After the required alloying time, the lamps are turned off, the gas flow is stopped and the susceptor is removed from the chamber. The heated wafer 18 causes alloying between the semiconductor material 18a and the ohmic contact metal 18b, here for example producing an ohmic contact between the metal 18b and the semiconductor 18a, here for example, source and drain contacts for a FET.

Figure 10A:
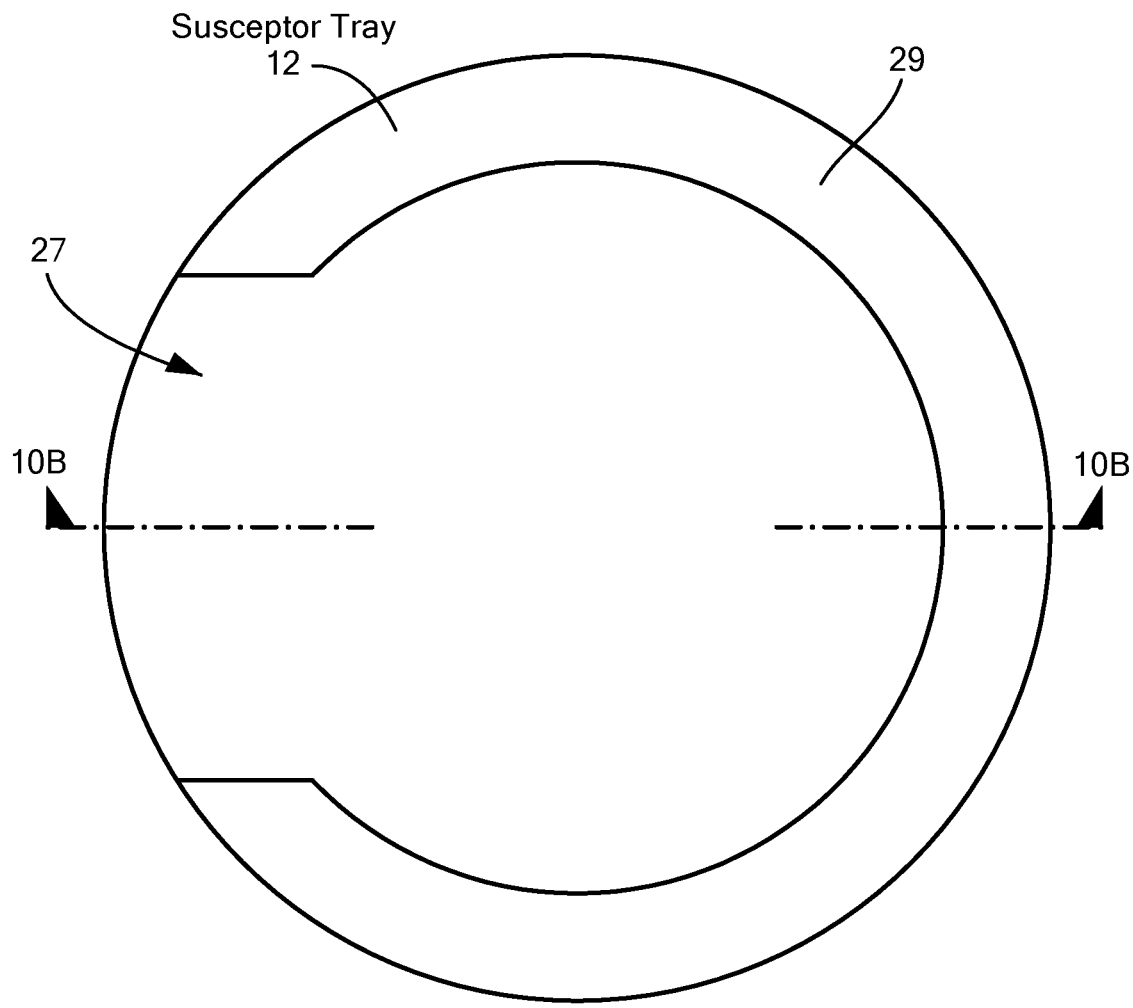
FIGS. 10A and 10B; are plan and cross sectional views of a susceptor tray for use with the susceptor tray cover of FIG. 9A according to another embodiment of the disclosure, the cross section being taken along line 10B-10B line FIG. 10A.
Figure 10B:
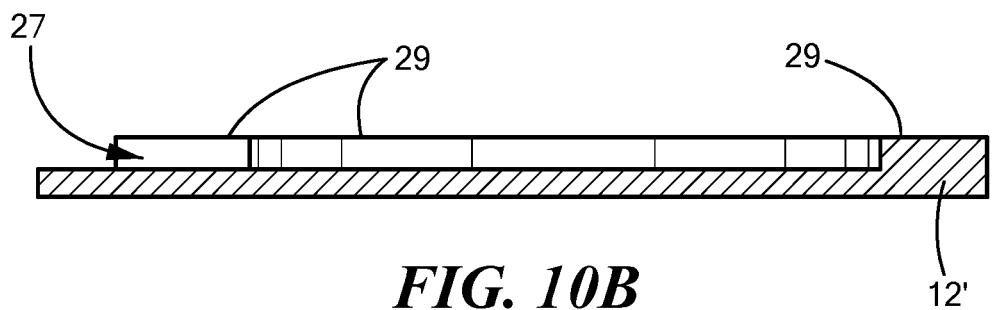
Figure 11A:
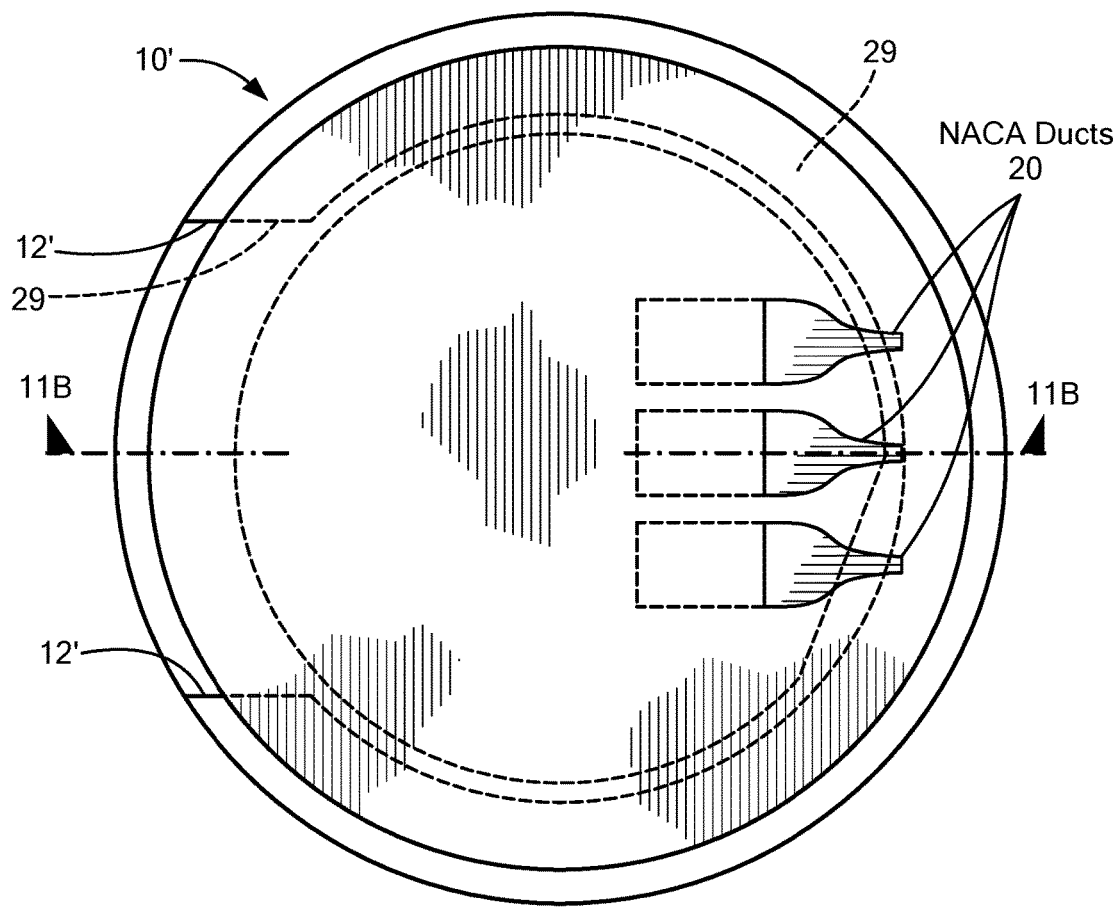
FIGS. 11A and 11B are plan and cross sectional views of a susceptor tray and susceptor tray cover of FIGS. 9A, 9B, 10A, and 10B assembled to provide a susceptor according to another embodiment of the disclosure.
Figure 11B:
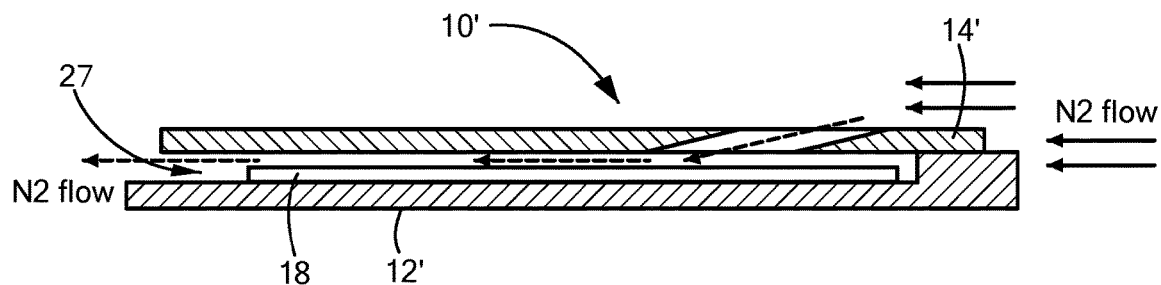

Referring to FIGS. 9A, 9B, 10A, 10B, 11A and 11B, another embodiment is shown of a susceptor 10' (FIGS. 11A and 11B) where the NACA duct outlet 22 (FIG. 4A) are removed along with the rearward portion of the vertical rim 29 of the susceptor tray 12 described in FIG. 3A as shown in FIGS. 10A and 10B. Thus, here the gas enters NACA duct inlets 20 of tray cover 14' passes over the wafer 18 and then exits the opening 27 in rim 29 of tray 12' as shown in FIGS. 11A and 11B.

Referring now to FIGS. 7A, 7B, 7C, 8A and 8B another embodiment of a susceptor 10" is shown. Here, the susceptor 10" (FIGS. 8A and 8B) has a tray cover 14" shown in FIGS. 7A and 7B for use with the susceptor tray 12 shown in FIGS. 3A and 3B. Here, the susceptor tray cover 14" does not have the NACA duct inlets 20 nor the NACA duct outlets 22 as in tray cover 14 (FIGS. 4A and 4B); but rather tray cover 14" has a plurality of vertically extending posts or standoffs 40 regularly spaced about the outer peripheral portions of the cover 14", shown in FIGS. 8A and 8B.

Figure 8A:
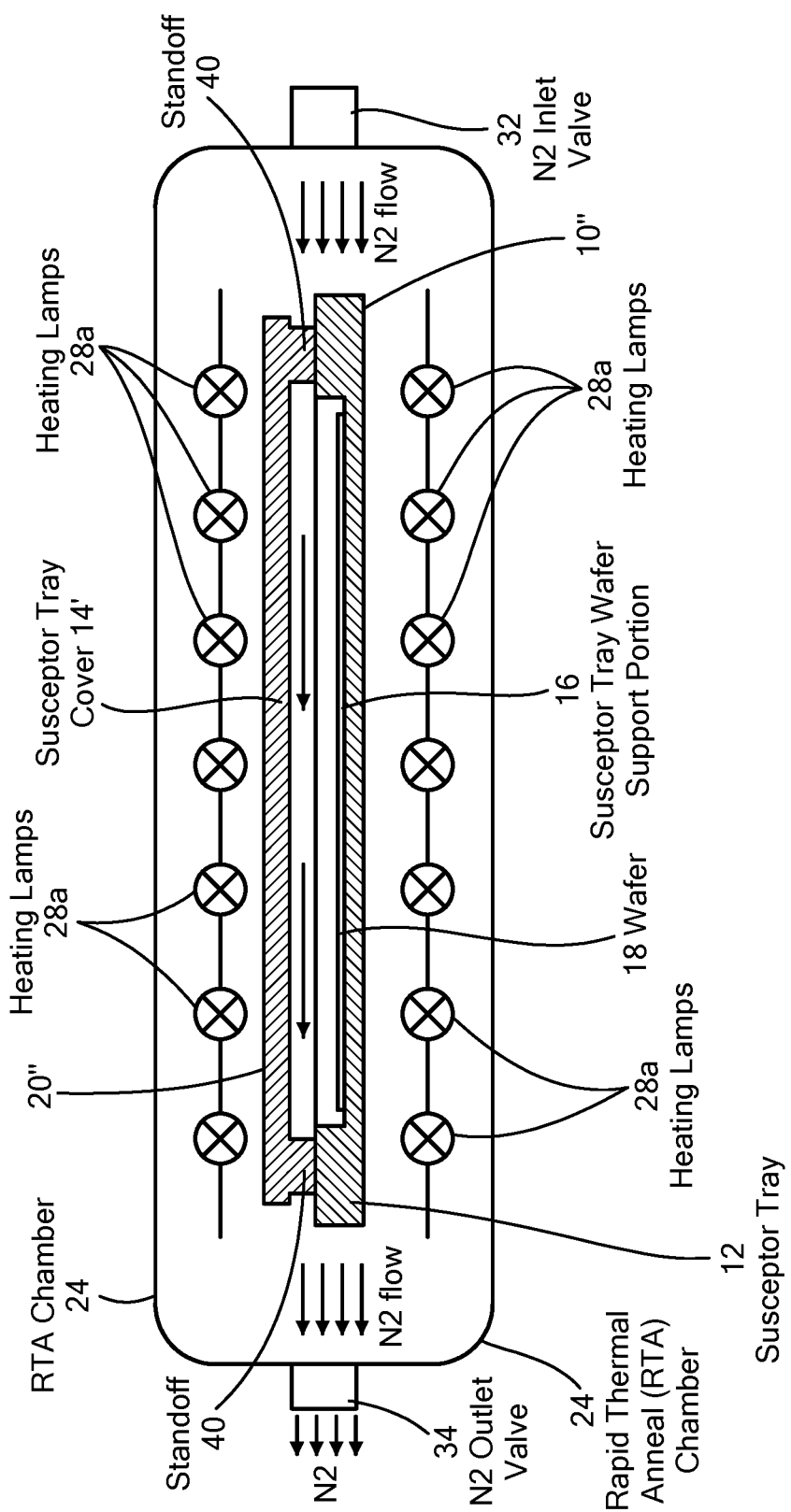
FIGS. 8A, 8B and 8C are a pair of elevation and a plan cross-sectional, diagrammatical sketch, respectively, of RTA apparatus having therein the susceptor tray and tray cover of FIGS. 7A, 7B and 7C according to the disclosure.
Figure 8B:
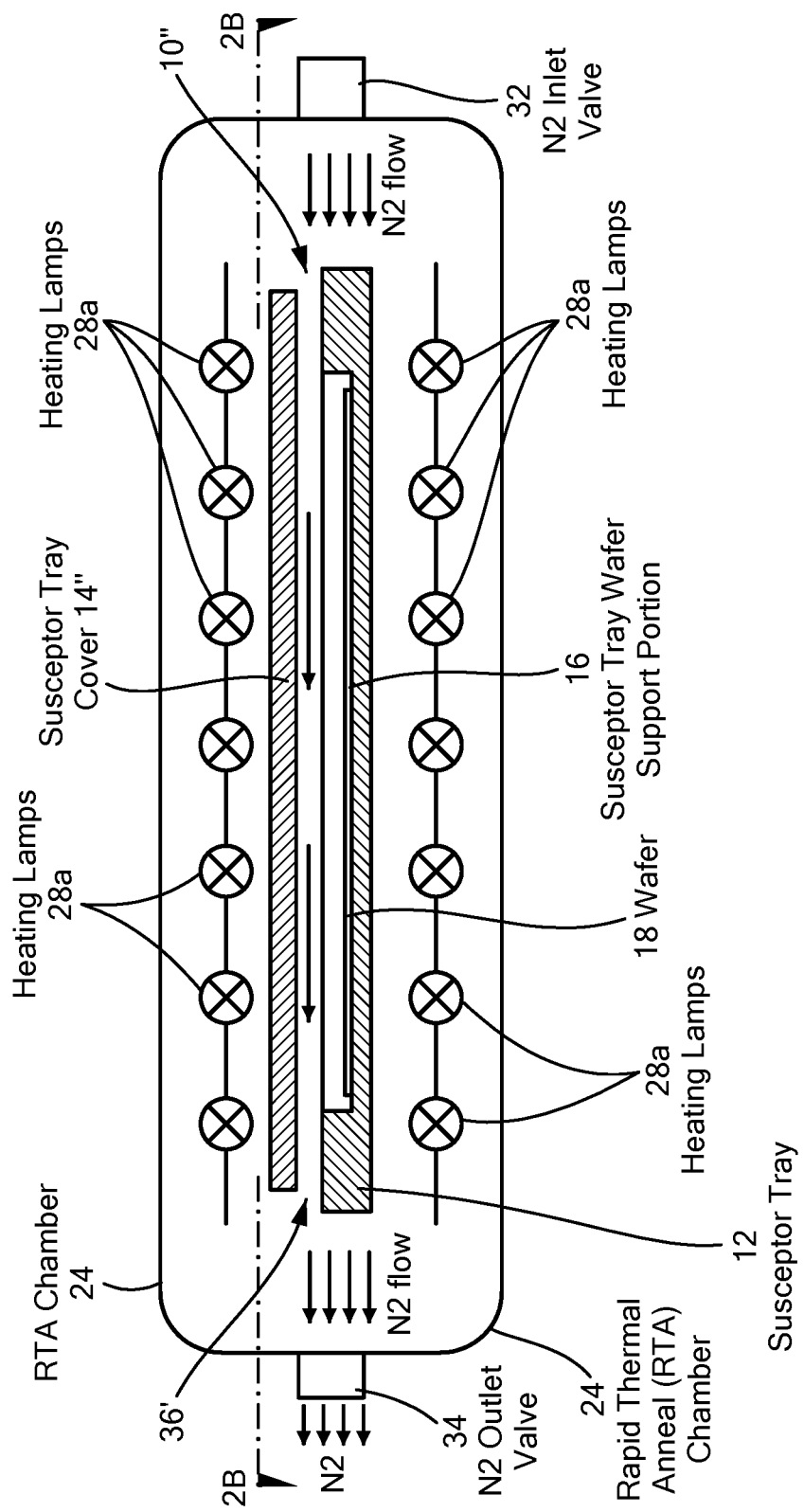
Figure 8C:
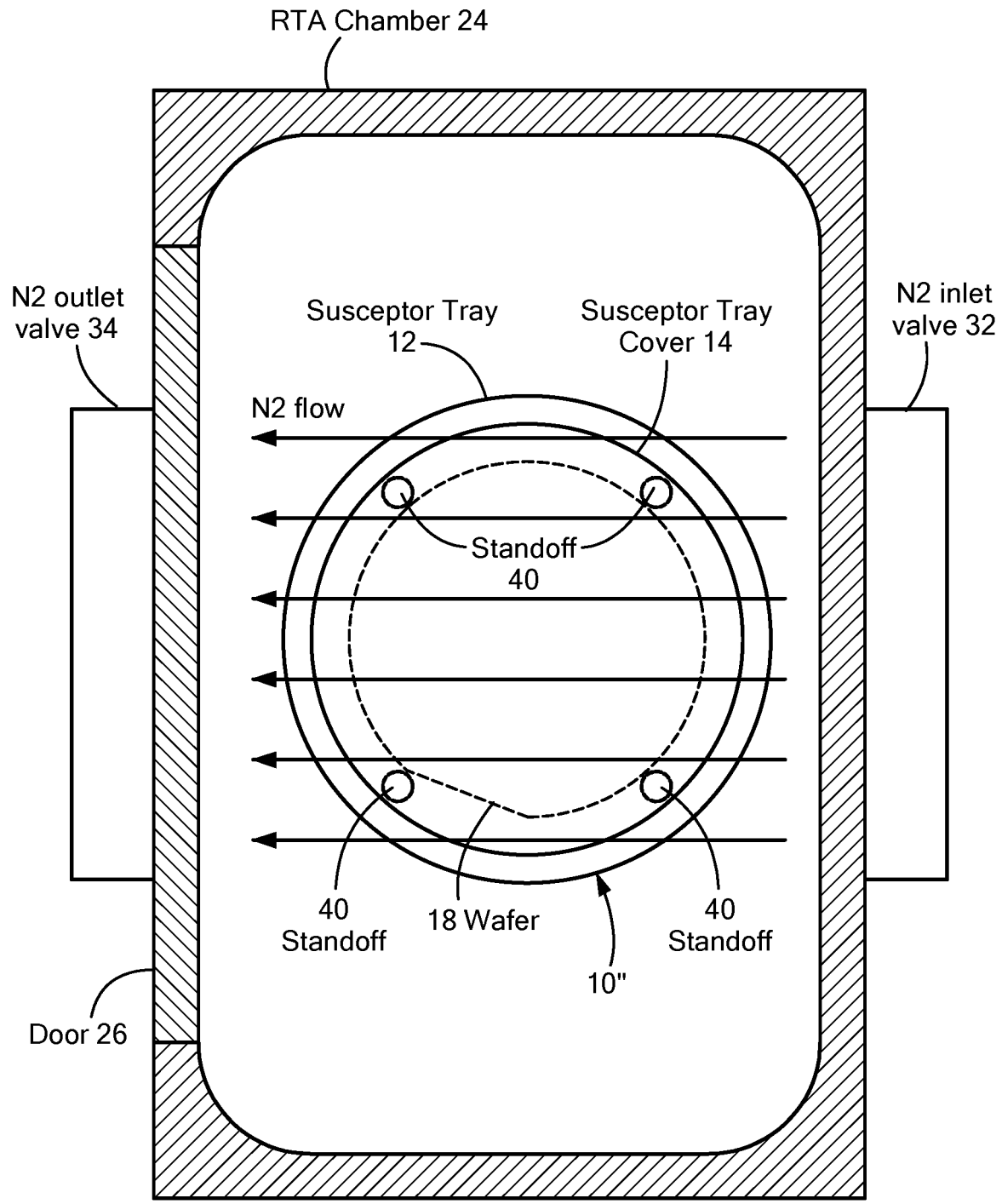
Figure 9A:
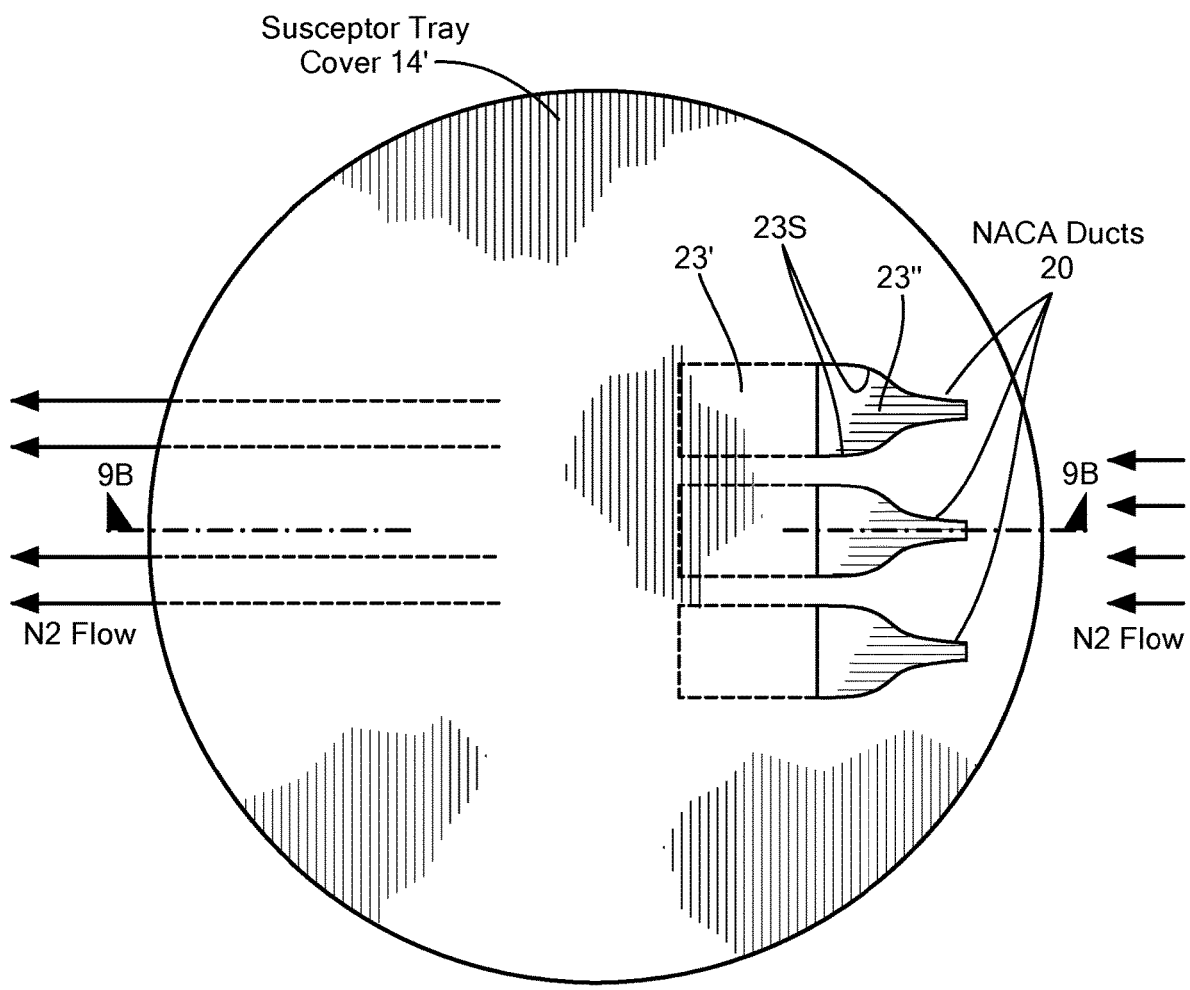
FIGS. 9A and 9B are plan and cross sectional views of a susceptor tray cover according to another embodiment of the disclosure, the cross section being taken along line 9B-9B line FIG. 9A.
Figure 9B:
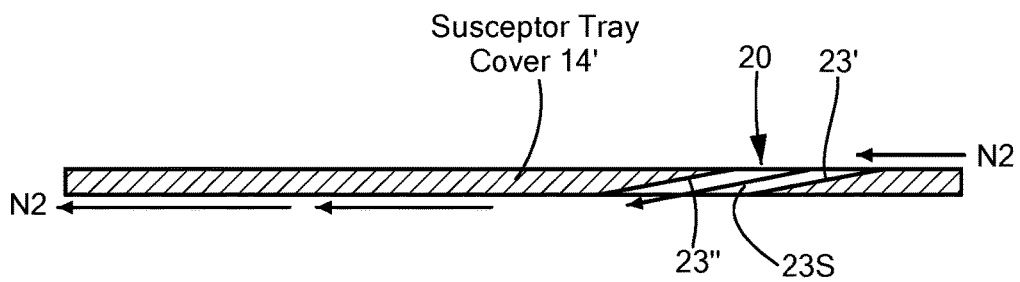

Referring to FIGS. 8A, 8B, and 8C, the wafer 18 is placed on the susceptor tray wafer support portion 16 of tray 12 and then the standoffs 40 of tray cover 14" are placed on the upper outer peripheral portions of the tray 12 after the wafer 18 is placed onto the susceptor tray wafer support portion 16. It is noted that an opening 36'(FIG. 8B) is formed by the space formed by the standoffs 40 disposed between the tray 12 and the tray cover 14" (the space between the tray cover 14" and the tray 12). More particularly, the standoffs 40 here all have the same finite predetermined height, H, (FIG. 7B) and thus the height of the opening 36' is also H. Thus, the opening 36' provides an interior region 36' for the susceptor 10'.

Next, the susceptor 10", with the wafer 18 on the susceptor tray wafer support portion 16 and with the standoffs 40 of the susceptor tray cover 14" on the tray 12, is inserted into an RTA chamber 24, through a door 26 of the RTA chamber 24, as shown in FIGS. 8A, 8B and 8C. Here again, the RTA chamber has therein a set 28a of horizontally disposed upper radiant heating lamps, here for example, halogen heating lamps, and a set 28b of horizontally disposed lower radiant heating lamps, here for example, halogen heating lamps. The susceptor 10" with the wafer 18 therein is positioned between two sets 28a, 28b of heating lamps, as shown in FIG. 8A. A source 30 of nitrogen, $N_2$, gas is provided as shown in FIG. 8A. The RTA chamber 24 has, at one side thereof, an inlet valve 32 fed by the source 30 of nitrogen gas, and has at the opposite side thereof an outlet valve 34, as in FIGS. 8A and 8B. Thus, during operation of the two sets 28a, 28b of lamps nitrogen gas passes through the inlet valve 32 into the interior region 36' (FIG. 8B) of the susceptor 10" having the wafer 18, then the gas passes over the wafer 18 then exits the interior region 36' then exits the chamber 24 through the outlet valve 34, as indicated by the arrows in FIGS. 8A, 8B and 8C. Thus, the standoffs 40 support the susceptor tray cover 14" over the susceptor tray 12 providing a space 36' between the susceptor tray cover 14" and the susceptor tray 12 and the space provides the opening to allow the flow of gas to pass from the source of gas into the susceptor 10" and then over the wafer 18 while heat absorbed by the susceptor 10' is transferred to the wafer 18.

A number of embodiments of the disclosure have been described. Nevertheless, it will be understood that various modifications may be made without departing from the spirit and scope of the disclosure. For example, other materials may be used for the susceptors 10, 10' and other gases, such as Argon, that will not adversely affect the ohmic contact alloying process may be used. Accordingly, other embodiments are within the scope of the following claims.

What is claimed is:

1. Apparatus for heating a wafer having a semiconductor material, comprising:
    a chamber;
    a source of radiant heat;
    a source of gas; and
    a susceptor disposed in the chamber to receive and absorb heat radiated by the source of radiant heat and transfer such absorbed heat to the wafer; the susceptor having an opening therein configured to allow a flow of gas to pass from the source of gas through an interior region of the susceptor and over the upper surface of the wafer to purge contaminants from within the susceptor during heating of the wafer.

2. The apparatus recited in claim 1 wherein the susceptor has a susceptor tray, such susceptor tray having a wafer support portion for supporting a bottom surface of the wafer; and a susceptor tray cover; and wherein the wafer is disposed on the wafer support portion and the susceptor tray cover is disposed over the upper surface of the wafer; and wherein the interior region is between the susceptor tray and the susceptor tray cover.

3. The apparatus recited in claim 2 wherein the susceptor tray cover is disposed on the susceptor tray.

4. The apparatus recited in claim 3 wherein the susceptor includes: a standoff for supporting the susceptor tray cover over the susceptor tray to provide the interior region between the susceptor tray cover and the susceptor tray.

5. The apparatus recited in claim 2 wherein the susceptor tray cover has an inlet and an outlet and wherein the inlet and outlet provide the opening therein configured to allow the flow of gas to pass from the source of gas into interior region of the susceptor and then through the interior region and then out of the interior region through the outlet.

6. Apparatus for heating a wafer having a semiconductor material, comprising:
    a chamber;
    a source of radiant heat;
    a source of gas; and
    a susceptor disposed in the chamber susceptor to receive and absorb heat radiated by the source of radiant heat and transfer such absorbed heat to the wafer, the susceptor comprising:
        a susceptor tray, such susceptor tray having a wafer support portion for supporting the wafer; and
        a susceptor tray cover; and
        wherein the susceptor tray cover is disposed over the wafer support portion;
    wherein the wafer is disposed between the susceptor tray cover and the wafer support portion, a bottom surface of the wafer being disposed on the wafer support portion, an upper surface of the wafer being disposed under, and spaced from, the susceptor tray cover; and
    wherein the susceptor tray cover has an inlet and an outlet and wherein the inlet is configured to receive a flow of gas from the source of gas, wherein the flow of gas received by the inlet passes between the susceptor tray and the susceptor tray cover through an interior region the susceptor, over the upper surface of the wafer; and then exits the interior region wafer to purge contaminants from within the susceptor during heating of the wafer.

7. Apparatus for heating a wafer having a semiconductor material, comprising:
    a chamber;
    a source of radiant heat;
    a source of gas; and
    wherein the wafer is disposed between the susceptor tray cover and the wafer support portion, a bottom surface of the wafer being disposed on the wafer support portion, an upper surface of the wafer being disposed under, and spaced from, the susceptor tray cover;
    a susceptor disposed in the chamber to receive and absorb heat radiated by the source of radiant heat with the wafer disposed within the susceptor and transfer such absorbed heat to the wafer; the susceptor having an opening therein configured to allow a flow of gas to pass from the source of gas into the susceptor and then over the upper surface of the wafer while heat absorbed by the susceptor is transferred to the wafer to purge contaminants from within the susceptor during heating of the wafer.

8. The apparatus recited in claim 7 wherein the susceptor has a susceptor tray, such susceptor tray having a wafer support portion for supporting the wafer; and a susceptor tray cover; and wherein the wafer is disposed on the wafer support portion and the susceptor tray cover is disposed over the wafer.

9. The apparatus recited in claim 8 wherein the susceptor tray cover is disposed on the susceptor tray.

10. The apparatus recited in claim 9 wherein the susceptor includes: a standoff for supporting the susceptor tray cover over the susceptor tray providing a space between the susceptor tray cover and the susceptor tray; and wherein the space provides the opening to allow the flow of gas to pass from the source of gas into the susceptor and then over the wafer while heat absorbed by the susceptor is transferred to the wafer.

11. The apparatus recited in claim 8 wherein the susceptor tray cover has an inlet and an outlet and wherein the inlet and outlet provide the opening therein to allow the flow of gas to pass from the source of gas into the susceptor and then over the wafer while heat absorbed by the susceptor is transferred to the wafer.

12. Apparatus for heating a wafer having a semiconductor material, comprising:
a chamber;
a source of radiant heat;
a source of gas; and
a susceptor disposed in the chamber susceptor, the susceptor comprising:
a susceptor tray, such susceptor tray having a wafer support portion for supporting the wafer; and
a susceptor tray cover; and
wherein the susceptor tray cover is disposed over the wafer support portion to receive and absorb heat radiated by the source of radiant heat and transfer such absorbed heat to the wafer;
wherein the susceptor tray cover has an inlet and an outlet; and
wherein the wafer is disposed between the susceptor tray cover and the wafer support portion, a bottom surface of the wafer being disposed on the wafer support portion, an upper surface of the wafer being disposed under, and spaced from, the susceptor tray cover; and
wherein the inlet receives a flow of gas from the source of gas and channels the received gas flow of gas between the susceptor tray and the susceptor tray cover through an interior region of the susceptor over the upper surface of the wafer while heat absorbed by the susceptor is transferred to the wafer and then channels the flow of gas, after passing over the wafer, to the outlet to purge contaminants from within the susceptor during heating of the wafer.

13. Apparatus for heating a wafer having a semiconductor material, comprising:
a chamber having an inlet and an outlet;
a source of radiant heat;
a source of gas fed into an interior region of the chamber through the inlet of the chamber;
a susceptor positioned in the interior region of the chamber to receive heat from the source of radiant heat as radiant heat, the susceptor comprising a material for absorbing the heat produced by the source of heat and received by the susceptor, the susceptor comprising:
a susceptor tray, such susceptor tray having a wafer support portion for supporting the wafer; and
a susceptor tray cover; and
wherein the susceptor tray cover is disposed over the wafer support portion to form an interior region the susceptor between the susceptor tray and the susceptor tray cover, the wafer being disposed on a surface of the wafer support portion of the susceptor tray in the interior region the susceptor;
wherein the susceptor has an inlet and an outlet; and
wherein the wafer is disposed between the susceptor tray cover and the wafer support portion, a bottom surface of the wafer being disposed on the wafer support portion, an upper surface of the wafer being disposed under, and spaced from, the susceptor tray cover;
wherein the inlet of the susceptor is configured to:
receive a flow of gas from the source of gas fed into the interior region of the chamber through the inlet of the chamber and then channeled through the interior region of the susceptor between susceptor tray cover and the susceptor tray along a direction parallel to the surface of the wafer support portion of the susceptor tray and pass over and along the upper surface of the wafer, then exit the interior region of the susceptor through the outlet of the susceptor and the pass out of the interior region of the chamber through the outlet of the chamber.

14. The apparatus recited in claim 13 wherein the chamber has door and wherein the door and the susceptor are configured to enable the susceptor to be inserted into, and removed from, the interior region of the chamber through the door.

15. The apparatus recited in claim 13 wherein the inlet and the outlet of the susceptor are on opposite sides of the susceptor.

16. The apparatus recited in claim 13 wherein the inlet and the outlet of the susceptor are on opposite sides of the susceptor and wherein the inlet and the outlet are on opposite sides of the chamber.

17. Apparatus for channeling a flow of contaminants purging gas over a wafer disposed in a susceptor to purge contaminants from within the susceptor during heating of the wafer, such wafer having a semiconductor material, comprising:
a source of radiant heat; and
wherein the susceptor comprises:
a susceptor tray, such susceptor tray having a wafer support portion for supporting the wafer; and
a susceptor tray cover; and
wherein the susceptor tray cover is disposed over the wafer support portion to receive and absorb heat radiated by the source of radiant heat and then transfers the absorbed heat to the semiconductor material;
wherein the susceptor tray cover has an inlet and an outlet; and
wherein the wafer is disposed between the susceptor tray cover and the wafer support portion, a bottom surface of the wafer being disposed on the wafer support portion, an upper surface of the wafer being disposed under, and spaced from, the susceptor tray cover;
wherein the inlet receives a flow of the contaminants purging and channels the received contaminants purging gas laterally along a direction parallel to the upper surface of the wafer between the upper surface of the wafer and the susceptor tray cover susceptor tray while heat absorbed by the susceptor is then transferred to the wafer and then channels the flow of contaminants purging gas, after passing over the upper surface of the wafer, to the outlet.

* * * * *